United States Patent
Raukas et al.

(10) Patent No.: US 8,884,330 B2
(45) Date of Patent: Nov. 11, 2014

(54) LED WAVELENGTH-CONVERTING STRUCTURE INCLUDING A THIN FILM STRUCTURE

(75) Inventors: Madis Raukas, Charlestown, MA (US); Adam M. Scotch, Amesbury, MA (US); Yi Zheng, Lynnfield, MA (US); Darshan Kundaliya, Beverly, MA (US)

(73) Assignee: Osram Sylvania Inc., Danvers, MA (US)

( * ) Notice: Subject to any disclaimer, the term of this patent is extended or adjusted under 35 U.S.C. 154(b) by 416 days.

(21) Appl. No.: 13/086,185

(22) Filed: Apr. 13, 2011

(65) Prior Publication Data

US 2012/0261688 A1    Oct. 18, 2012

(51) Int. Cl.
*H01L 33/00*    (2010.01)
*H01L 33/50*    (2010.01)

(52) U.S. Cl.
CPC ....... *H01L 33/505* (2013.01); *H01L 2933/0041* (2013.01); *H01L 2933/0091* (2013.01)
USPC .............................. 257/103; 257/79; 257/102

(58) Field of Classification Search
USPC ...................................... 257/79, 98, 102, 103
See application file for complete search history.

(56) References Cited

U.S. PATENT DOCUMENTS

| 7,341,878 | B2 | 3/2008 | Krames et al. |
| 7,361,938 | B2 | 4/2008 | Mueller et al. |
| 2007/0126017 | A1 | 6/2007 | Krames et al. |
| 2007/0159067 | A1 | 7/2007 | Yun et al. |
| 2008/0042153 | A1* | 2/2008 | Beeson et al. ................. 257/94 |
| 2008/0049430 | A1 | 2/2008 | Sakumoto |
| 2008/0283864 | A1 | 11/2008 | LeToquin et al. |

FOREIGN PATENT DOCUMENTS

| EP | 1 811 580 | 7/2007 |
| EP | 2 070 891 | 6/2009 |
| WO | WO 2007/148829 | 12/2007 |
| WO | WO 2009/074944 | 6/2009 |
| WO | WO 2009/148176 | 12/2009 |
| WO | WO 2010/030430 | 3/2010 |

OTHER PUBLICATIONS

Abstract, M. Kottiasamy et al., Pulsed laser deposited Y3Al5O12:Ce phosphor thin films for blue light converted white light emitting diodes (2005).
J.G. Ameen et al., Etching of High Alumina Ceramics to Promote Copper Adhesion, J. Electrochem. Soc. 120 (1973) 1518-1522.
K.C. Lee et al., The Comparison of ITO Ablation Characteristics Using KrF Excimer and Nd:YAG Laser, Proc. SPIE 4426 (2002) 260-263.
H. Beyer et al., Interaction of CO2 laser pulses of microsecond duration with Al2O3 ceramic substrates, J. Appl. Phys. 70 (1991) 75-81.
Y.R. Do et al., Improved Cathodoluminescence Output Coupling of ZnS:Tb Thin-Film Phosphors Deposited on 2D SiO2 Corrugated Glass Substrate, J. Electrochem. Soc. 150 (2003) H260-H265.

(Continued)

*Primary Examiner* — Ori Nadav
(74) *Attorney, Agent, or Firm* — Robert F. Clark

(57) ABSTRACT

A wavelength-converting structure for a wavelength-converted light emitting diode (LED) assembly. The wavelength-converting structure includes a thin film structure having a non-uniform top surface. The non-uniform top surface is configured increase extraction of light from the top surface of a wavelength-converting structure.

13 Claims, 5 Drawing Sheets

(56) References Cited

OTHER PUBLICATIONS

J. Ihlemann et al., Micro patterning of fused silica by ArF- and F2-laser ablation, Journal of Physics: Conference Series 59 (2007) 206-209.

K. Develos et al., Effect of deposition rate on the surface morphology of CeO2 films deposited by pulsed laser deposition, Physica C 320 (1999) 21-30.

Z. Kowalski, Roughness of alumina surface after ion-beam irradiation, J. Mat. Sci. Lett. 10 (1991) 1329-1332.

Nikolov et al., Effect of the Hydrodynamics in High-Temperature Solutions on the Quality of Pure and Substituted YIG Single Crystals Grown by the TSSG Method, J. Crystal Growth 75 (1986) 269-276.

Jones et al., Pulsed laser deposition of Y2O3:Eu thin film phosphors, Displays 19 (1999) 151-167.

Jones et al., Luminescence of pulsed laser deposited Eu doped yttrium oxide films, Appl. Phys. Lett. 71 (3) (1997) 404-406.

U.S. Army Materiel Development and Readiness Command, Growing Single-Crystal Nd:YAG, 2301 N.T.I. S. Tech Notes (1983).

* cited by examiner

006
LED WAVELENGTH-CONVERTING STRUCTURE INCLUDING A THIN FILM STRUCTURE

TECHNICAL FIELD

The present application relates to light emitting diode (LED) light sources and, more particularly, to an LED wavelength-converting structure that includes a thin film structure.

BACKGROUND

Known LED chips generate visible or non-visible light in a specific region of the light spectrum. The light output from the LED may be, for example, blue, red, green or non-visible ultra-violet (UV) or near-UV, depending on the material composition of the LED. When it is desired to construct an LED light source that produces a color different from the output color of the LED, it is known to convert the LED light output having a peak wavelength (the "primary light") to light having a different peak wavelength (the "secondary light") using photoluminescence.

The photoluminescence process involves absorbing the higher energy primary light by a wavelength-converting material such as a phosphor or mixture of phosphors thereby exciting the phosphor material, which emits the secondary light. The peak wavelength of the secondary light depends on the type of phosphor material, which can be chosen to provide secondary light having a particular peak wavelength. This process may be generally referred to as "wavelength conversion" and an LED combined with a wavelength-converting structure that includes wavelength-converting material, such as phosphor, to produce secondary light, may be described as a "phosphor-converted LED" or "wavelength-converted LED."

Depending on the processing method and/or properties of the wavelength-converting material, at least a portion of the primary light and/or secondary light may be lost due to internal reflection, scattering, and/or absorption in the wavelength-converting structure. Further, for some wavelength-converting structures, e.g., powder phosphor or ceramic layer(s), multiple internal interfaces may impede heat transfer and therefore dissipation of heat produced by the LED and phosphor materials.

BRIEF DESCRIPTION OF THE DRAWINGS

Reference should be made to the following detailed description which should be read in conjunction with the following figures, wherein like numerals represent like parts.

DETAILED DESCRIPTION

A wavelength-converting structure consistent with the present disclosure generally includes a thin film structure having a non-uniform (i.e., rough) top surface. Preferably, the non-uniformity of the surface is created during the deposition of the thin film structure, i.e., "as-grown," and consequently no post-deposition processing is needed to form the non-uniform surface. Compared to a smooth/polished top surface, the non-uniform top surface allows more light to escape from the wavelength-converting structure as a whole, and particularly in the forward direction, i.e. normal to the top surface of the wavelength-converting structure. It is believed more light escapes in the forward direction because the non-uniform top surface may loosen the critical condition for total internal reflection (TIR) from the wavelength-converting structure. Scattering within the thin film structure may be inhibited by selection of the grain sizes or other inhomogeneities in the thin film structure to enhance transmission of light to the top surface.

The thin film structure may be formed using a physical vapor deposition (PVD) process, such as evaporative deposition, sputter deposition or pulsed laser deposition. To form the non-uniform top surface of the thin film structure at least one parameter associated with the PVD process may be adjusted during the PVD process. The wavelength-converting structure may be combined into a wavelength-converted LED package whereby primary light emitted by an LED passes through the bottom surface of the wavelength-converting structure. The wavelength-converting structure is configured to emit a secondary light in response to the primary light imparted thereon.

Figure 1:
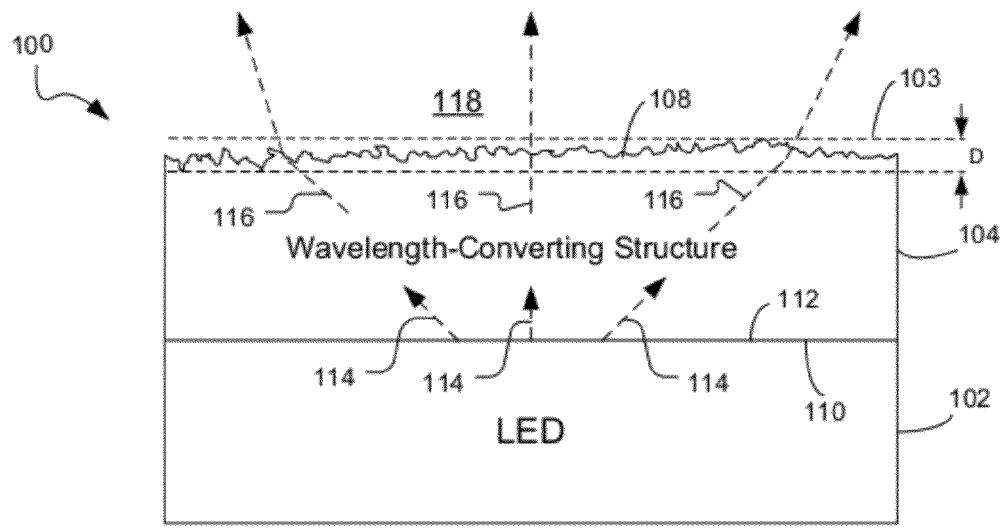
FIG. 1 diagrammatically illustrates one embodiment of a wavelength-converted LED including a wavelength-converting structure consistent with the present disclosure.

FIG. 1 diagrammatically illustrates a wavelength-converted LED assembly 100 consistent with the present disclosure. The illustrated assembly includes a known LED 102 and a wavelength-converting structure 104 consistent with the present disclosure. The LED 102 may be any known LED, including, but not limited to a nitride III-V LED such as an InGaN LED. The LED 102 emits primary light at a peak wavelength through an emitting surface 110 thereof. The bottom surface 112 of the wavelength-converting structure 104 is positioned in opposed facing relationship to the emitting surface 110 of the LED 102. It is to be understood that FIG. 1 is provided in diagrammatic form for ease of illustration and explanation, and, for example, the bottom surface 112 of the wavelength converting structure 104 and the emitting surface 110 the LED 102 may have substantially different (roughened, structured, etc.) character from the indicated flat/polished surfaces, depending on the desired optical out-coupling and in-coupling.

Generally, primary light, e.g., as indicated by arrows 114, emitted from the emitting surface 110 of the LED 102, passes through the bottom surface 112 of the wavelength-converting structure 104 and excites wavelength-converting material therein, which emits the secondary light, e.g. indicated by arrows 116. The secondary light (and in some cases, also some of the primary light) passes through the top surface 108 of the wavelength-converting structure 104. To facilitate extraction of primary and/or secondary light from the wavelength-converting structure 104 into a medium 118 (e.g., air), the top surface 108 of the wavelength-converting structure 104 may be non-uniform.

In general, the non-uniformity of the top surface 108 may be chosen to improve extraction of light from the top surface 108 compared to a substantially flat/polished top surface. To accomplish such extraction the top surface may include deviations that are on the order of the peak wavelength of the light emitted by the LED 102. The term "non-uniform" as used herein with respect to a surface, e.g. of the wavelength-converting structure 104, thus refers to a surface having substantially random deviations D in the range of 100 nm to 5000 nm represented, for example, by the dashed line 103. Preferably the deviations are in the range of 500 nm to 2000 nm to enhance the scattering of visible light.

The wavelength-converting structure 104 may be constructed using materials and combinations of materials including known phosphors for achieving a desired wavelength conversion, such as cerium-activated yttrium aluminum garnet, $Y_3Al_5O_{12}$:Ce, (YAG:Ce), cerium-activated lutetium aluminum garnet, $Lu_3Al_5O_{12}$:Ce, (LuAG:Ce), europium-activated strontium silicon oxynitride, (Sr—SiON:Eu), etc. The wavelength-converting structure 104 may be formed on the LED 102 or may be formed separately from the LED 102. In one example, an LED die, such as a III-nitride die, is positioned in a reflector cup package and a wavelength-converting structure 104 may be formed by depositing wavelength-converting material directly on the surface of the die. In another example, the wavelength-converting material may be provided in or on a solid, self-supporting flat substrate or plate. The plate may be attached to the LED, e.g. by wafer bonding, sintering, gluing, etc. Such a plate may be referred to herein as a "wavelength-converting plate." The wavelength-converting structure 104 may also be provided on a self-supporting substrate or plate, which is then bonded to the LED die and subsequently separated from the supporting plate, removing the plate and leaving the wavelength-converting structure 102 attached to the LED die. In another example, the wavelength-converting structure 102 may be provided in a self-supporting dome formed separately from the LED and attached thereto.

In one embodiment, the wavelength-converting structure 104 may be spaced from the LED 102. Positioning the wavelength-converting structure 104 a distance from the LED 102 generally allows the wavelength-converting structure 104 to be formed into a shape that may be different from the surface of the LED 102. In another embodiment, the wavelength-converting structure 104 may be formed on the LED 102.

A wavelength converting structure 104 including a non-uniform top surface 108 consistent with the present disclosure may be take a variety of configurations. In one embodiment, for example, the wavelength converting structure 104 may include a substrate with a thin film structure formed on the top and/or bottom surface of the substrate. In another configuration, the wavelength converting structure 104 may include only a thin film structure deposited on the surface of the LED 102 or on another surface spaced therefrom, e.g. on the surface of a self-supporting dome. In another configuration, a thin film structure may be formed on a substrate that is removed after positioning over the LED to leave a wavelength converting structure 104 including only the thin film structure. A wavelength-converting structure 104 including a thin film structure consistent with the present disclosure may allow superior heat conductance compared to a ceramic or powder phosphor layer, because of a lack of discrete boundaries within the thin film structure, consistent with the present disclosure.

Figure 2A:
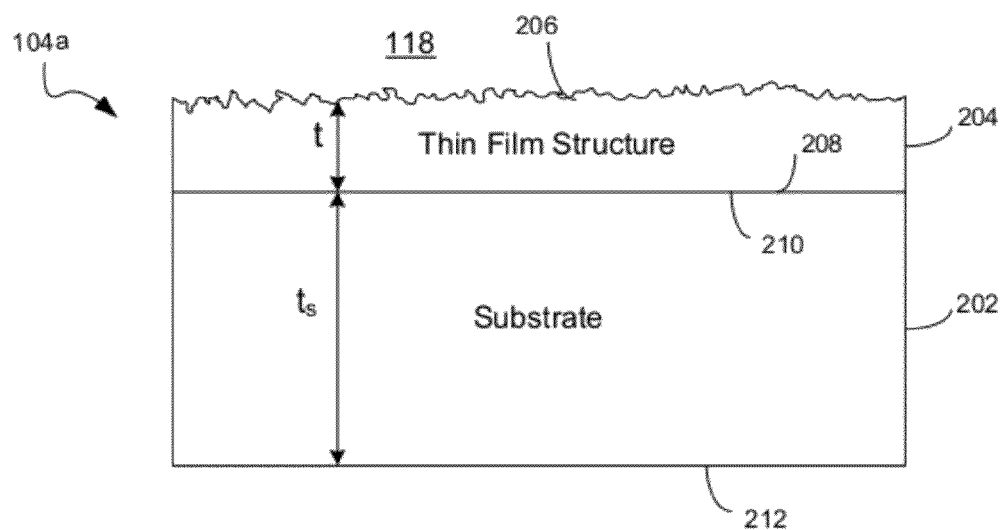
FIG. 2A diagrammatically illustrates one embodiment of a wavelength-converting structure including a thin film structure with a non-uniform top surface consistent with the present disclosure.

FIG. 2A, for example, diagrammatically illustrates one embodiment 104a of a wavelength-converting structure consistent with the present disclosure. The wavelength-converting structure 104a includes a substrate 202 and a thin film structure 204 formed thereon.

The substrate 202 has a top surface 210 and an opposing bottom surface 212. The thin film structure 204 includes at least one thin film layer and has a top surface 206 and an opposing bottom surface 208. The thin film structure bottom surface 208 is positioned in opposed facing relationship to the substrate top surface 210. It is to be understood that use of the terms "top" and "bottom" is for ease of description and is not meant to limit the wavelength-converting structure 104a to a particular orientation in space. It is to be further understood that FIG. 2A is provided in diagrammatic form for ease illustration and explanation, and, for example, the bottom surface 208 of the thin film structure 204 may be non-uniform, as opposed to the indicated flat/polished surface character, depending on the desired optical out-coupling and in-coupling.

The substrate 202 forms a stable structure on which the thin film structure 204 may be deposited. The substrate 202 may be constructed using monocrystalline or polycrystalline materials formed into a rigid plate structure using known ceramic, thin film deposition or crystal growth methods. Useful monocrystalline substrate materials include YAG (yttrium aluminum garnet), e.g., YAG (100), and sapphire, e.g., c-sapphire (0001) and r-sapphire. Useful polycrystalline substrate materials include YAG, alumina ($Al_2O_3$), and AlN. The substrate 202 may be formed of other monocrystalline or polycrystalline materials (e.g., GaN), as may be known to those skilled in the art.

To inhibit scattering of the primary light in the substrate 202, the grains and other inhomogeneities in the substrate material may be kept smaller than the wavelength of the primary light. The thickness $t_s$ of the substrate 202 may be chosen to provide support for the thin film structure 204 and desired transmission of the primary light therethrough. In one example, the thickness $t_s$ may be in the range of 0.05-1 mm (millimeters).

The thin film structure 204 may be deposited on the substrate 202 using a physical vapor deposition process to establish a non-uniform top surface 206 configured to allow more light to escape from the thin film structure 204 in the forward direction, e.g. normal to the top surface 206, than would escape if the top surface 206 were uniform. The thin film structure 204 may be formed from a variety of materials or mixture of materials (e.g., YAG:Ce) having a refractive index the same as or similar to (e.g. within about 10%) the refractive index of the substrate 202. For example, an epitaxial structure may be formed with the substrate 202 formed of YAG and the thin film structure 204 formed of YAG:Ce. In one embodiment, the thin film structure 204 may be formed from a different material than the substrate 202. For example, the substrate 202 may include sapphire and the thin film structure 204 may be formed of YAG:Ce. To inhibit scattering in the thin film structure 204, the grains and other inhomogeneities in the thin film structure may be kept smaller than the wavelength of the primary light.

The thin film structure 204 has a thickness, t, between the top surface 206 and the opposing bottom surface 208. An amount of primary light that may be converted into secondary light depends on the thickness, t, of the thin film structure 204. The thickness t may thus be chosen depending on the desired amount of wavelength conversion. Preferably, the thickness of the thin film structure is less than about 20 μm (micrometers). In one example, the thickness, t, may be in the range of 1 μm to 15 μm.

Figure 2B:
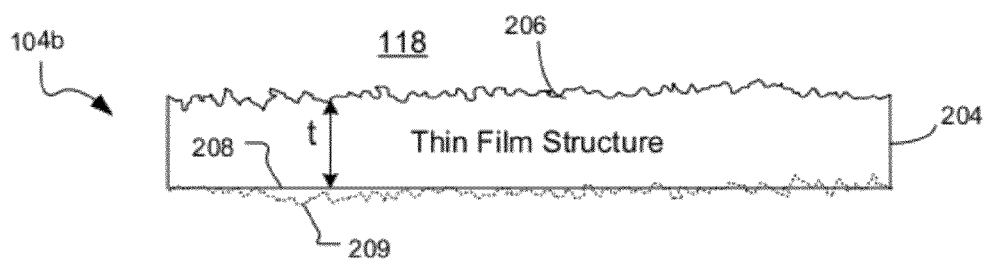
FIG. 2B diagrammatically illustrates another embodiment of a wavelength-converting structure including a thin film structure with a non-uniform top surface consistent with the present disclosure.

FIG. 2B diagrammatically illustrates another embodiment 104b of a wavelength-converting structure consistent with the present disclosure. The wavelength-converting structure 104b includes only a thin film structure 204. A wavelength converting structure 104b including only a thin film structure 204 consistent with the present disclosure may be deposited directly on the emitting surface of an LED 102 (FIG. 1). Alternatively, the thin film structure 204 may be formed on a substrate (e.g. substrate 202 in FIG. 2A) or other rigid element that is removed using, for example, a known laser-liftoff process after the substrate and thin film structure are positioned above the light emitting surface of the LED to leave only the thin film structure 204 positioned over the LED. Also, as shown, the thin film structure 204 may include a flat/polished bottom surface 208 or a non-uniform bottom surface 209 depending upon the optical desired optical outcoupling and in-coupling.

Figure 3:
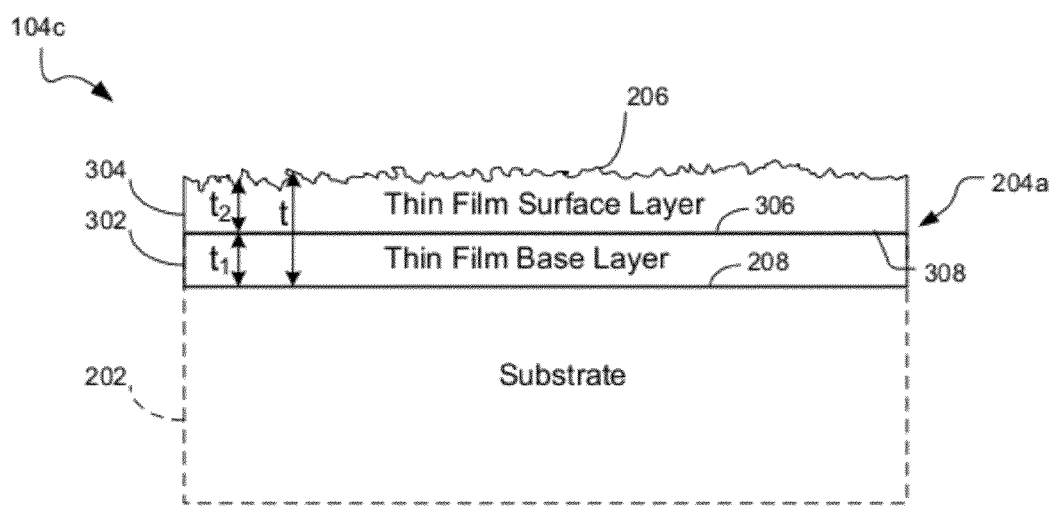
FIG. 3 diagrammatically illustrates another embodiment of a wavelength-converting structure including a thin film structure with a non-uniform top surface consistent with the present disclosure

The thin film structure 204 may be constructed of one or more thin film layers with a non-uniform top surface formed using a physical vapor deposition process. FIG. 3, for example, diagrammatically illustrates an embodiment 104c of a wavelength-converting structure including a multi-layer thin film structure 204a consistent with the present disclosure. As shown, the multi-layer thin film structure 204a may be formed on a substrate 202. Alternatively and as discussed above, the thin film structure 204a may be deposited directly on an LED or on a substrate that is subsequently removed.

For ease of explanation only, FIG. 3 will be described as including a thin film 204a structure formed on the substrate 202. In the illustrated exemplary embodiment, the thin film structure 204a includes a thin film base layer 302 and a thin film surface layer 304. The thin film base layer 302 has a top surface 306 and an opposing bottom surface 208 corresponding to the bottom surface of the thin film structure 204a. The bottom surface 208 may be a uniform or non-uniform surface.

The thin film surface layer 304 has a bottom surface 308 and an opposing top surface 206 corresponding to the top surface of the thin film structure 204a. The bottom surface 308 of the thin film surface layer 304 is positioned in opposed facing relationship to the top surface 306 of the thin film base layer 302. The top surface 206 of the thin film surface layer 304 is a non-uniform surface.

The thin film structure 204a has a thickness, t, between the top surface 206 and the opposing bottom surface 208, including a thickness, $t_1$, of the thin film base layer 302 and a thickness, $t_2$, of the thin film surface layer 304. The thicknesses t, $t_1$ and $t_2$ may be chosen to provide a desired conversion of primary light into secondary light. For example, the thickness, t, may be in the range 1 to 15 μm, the thickness $t_1$ may be in the range of 800 nm (nanometers) to 12 μm, and the thickness, $t_2$, may be in the range 200 nm to 3 μm. While FIG. 3 depicts a two layer thin film structure 104c, it will be understood that more (or fewer) layers are possible in a structure consistent with the present disclosure.

The thin film base layer 302 and the thin film surface layer 304 may be formed from a variety of materials or mixture of materials (e.g., YAG:Ce). The material(s) used to form the thin film base layer 302 may be the same as or may differ from the material(s) used to form the thin film surface layer 304. For example, the layers may have different refractive indexes, or may be configured to have the same or similar, e.g. within about 10%, refractive indexes. The thin film base layer 302 may be configured to be generally non-scattering. In one embodiment, for example, the base layer 302 may be an epitaxial thin film or, preferably, a single crystalline thin film phosphor whereas the thin film surface layer 304 may be a polycrystalline thin film phosphor and have grain sizes configured to induce scattering. Preferably, the base layer and the surface layer are composed of substantially the same material, e.g., YAG:Ce.

The thin film base layer 302 and the thin film surface layer 304 may be deposited using a physical vapor deposition process consistent with the present disclosure. Parameters associated with the deposition process may be adjusted during the process in order to deposit the thin film base layer 302 and the thin film surface layer 304 consistent with the present disclosure. In this manner, the deposition process may be configured to deposit a generally non-scattering thin film base layer 302 and a scattering thin film surface layer 304.

Figure 4:
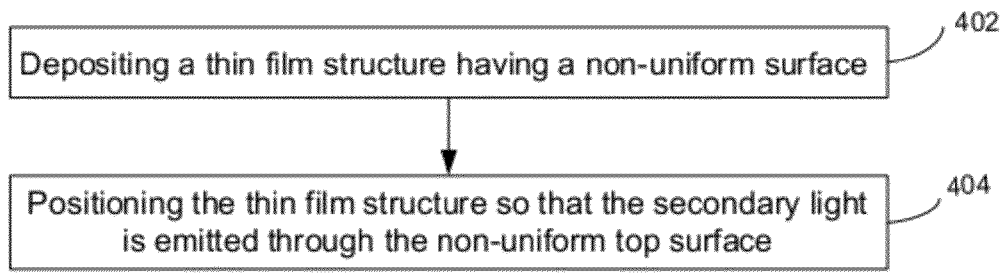
FIG. 4 is a block flow diagram illustrating one method consistent with the present disclosure.
Figure 5:
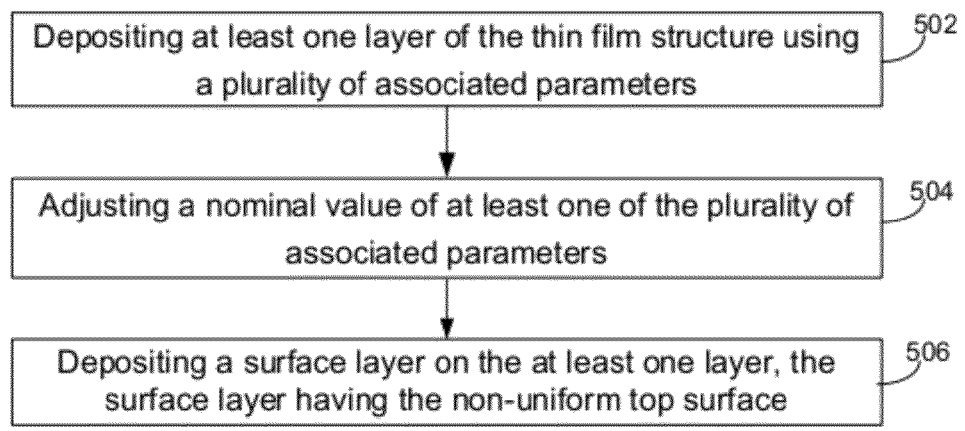
FIG. 5 is a block flow diagram illustrating another method consistent with the present disclosure.

FIGS. 4 and 5 are block flow diagrams illustrating exemplary methods consistent with the present disclosure. The illustrated block flow diagrams may be shown and described as including a particular sequence of steps. It is to be understood, however, that the sequence of steps merely provides an example of how the general functionality described herein can be implemented. The steps do not have to be executed in the order presented unless otherwise indicated.

FIG. 4 illustrates a method of forming a wavelength-converting structure for a wavelength-converted light emitting diode (LED) assembly consistent with the present disclosure wherein the wavelength-converting structure is configured to receive primary light from the LED and emit secondary light in response to the primary light being imparted thereon. The illustrated method includes depositing 402 a thin film structure having a non-uniform surface. The thin film structure may be deposited using a physical vapor deposition process, such as such as evaporative deposition, sputter deposition or pulsed laser deposition. The thin film structure may be positioned 404, either during the deposition or in a separate step, so that the secondary light is emitted through the non-uniform top surface. The thin film structure may, for example, be deposited on the top surface of a substrate. The combination of the substrate with the thin film structure deposited thereon may be positioned over the LED so that secondary light is emitted through the non-uniform top surface. Alternatively, the substrate may be subsequently removed as described above or the thin film structure may be deposited directly on the LED.

As will be understood by those skilled in the art, each physical vapor deposition process includes a plurality of associated parameters whose nominal values may be selected and/or adjusted to yield a thin film structure with one or more desired properties. As used herein, use of the term "nominal" or "nominally" when referring to an amount means a designated or theoretical amount that may vary from the actual amount. For example, process parameters associated with pulsed laser deposition include temperature, deposition pressure, laser repetition rate, total number of laser pulses, and the gas environment to grow the films, e.g. $N_2$, $H_2$, Ar or forming gas. The nominal value(s) of one or more parameters chosen may depend on the substrate material, a desired thickness of the thin film structure and/or a desired surface characteristic (e.g., uniform or non-uniform) of the thin film structure. Nominal value(s) of the parameters may be adjusted during the deposition process to thereby change one or more characteristics of the thin film structure. For example, a process of depositing 402 the thin film structure with a non-uniform top surface may begin with a first set of nominal values of associated deposition parameters. The first set of nominal values may be configured to deposit a non-scattering portion of the thin film structure. After a desired non-scattering thickness is deposited, one or more of the nominal value(s) of the deposition parameters may then be adjusted to establish a second set of values. The second set of values may be configured to form the non-uniform top surface 206 (FIG. 2) of the thin film structure consistent with the present disclosure.

As shown in FIG. 5, for example, the depositing of a thin film structure of FIG. 4 may be accomplished by a method including depositing 502 at least one layer of the thin film structure using a plurality of associated deposition parameters. For example, the depositing may be accomplished with a first set of nominal values of associated pulsed laser deposition parameters. The first set of nominal values may be configured to produce a thin film base layer with one or more desired characteristics, e.g., thickness, non-scattering.

One or more of the nominal value(s) may then be adjusted 504 and a surface layer may be deposited 506 on the at least one layer. The surface layer may have a non-uniform top surface. For example, one or more of the nominal value(s) may be adjusted to establish a second set of values configured to form the thin film surface layer. In one example, the value(s) may be adjusted while depositing the wavelength-converting material. In another example, the depositing may be paused while the value(s) of the parameter(s) are being adjusted and the depositing may then resume with the second set of values.

Figure 6:
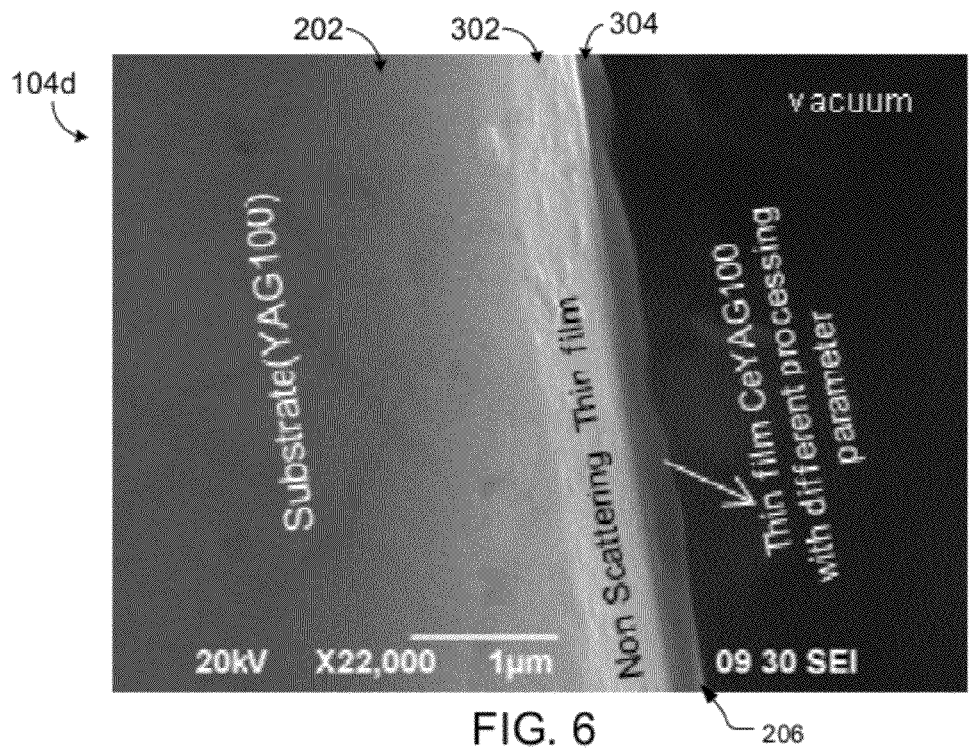
FIG. 6 is a scanning electron micrograph of an exemplary wavelength-converting structure including a thin film structure with a non-uniform top surface consistent with the present disclosure.

FIG. 6 is a scanning electron micrograph of an exemplary wavelength-converting structure 104d consistent with the present disclosure. The wavelength-converting structure 104d includes a substrate 202 and a thin film structure including a thin film base layer 302 and a thin film surface layer 304 having an as-grown non-uniform top surface 206. In this example, the wavelength-converting structure is epitaxial since the substrate 202 is YAG (100) and the thin film base layer 302 and thin film surface layer 304 are formed of the same material, i.e. YAG:Ce. The substrate 202 has a thickness of about 500 µm, the thin film base layer 302 has a thickness of about 500 nm, and the thin film surface layer 304 has a maximum thickness of about 250 nm. It is to be understood, however, that the thicknesses of the layers in the illustrated example are provided for illustration only, and that the thickness provided in any embodiment would depend on the desired amount of wavelength conversion in the application.

The thin film base layer 302 and thin film surface layer 304 shown in FIG. 6 were formed using pulsed laser deposition. Table 1 includes the nominal values for the first set of parameters (labeled "Base" in Table 1) associated with depositing the thin film base layer 302 and the second set of parameters (labeled "Surface" in Table 1) associated with depositing the thin film surface layer 304 exhibiting a non-uniform top surface 206. The deposition pressure parameter given in Tables 1 and 2 is the partial pressure of oxygen ($P_{O2}$). A YAG:Ce target containing 4 atomic percent cerium was used in the deposition processes.

TABLE 1

| Thin Film Layer | Temperature (° C.) | Deposition Pressure ($P_{O2}$ mTorr) | Laser Repetition Rate (Hz) | Total Number of Laser Pulses |
|---|---|---|---|---|
| Base | 950 | 1 | 5 | 36000 |
| Surface | 950 | 20 | 20 | 12000 |

Figure 7:
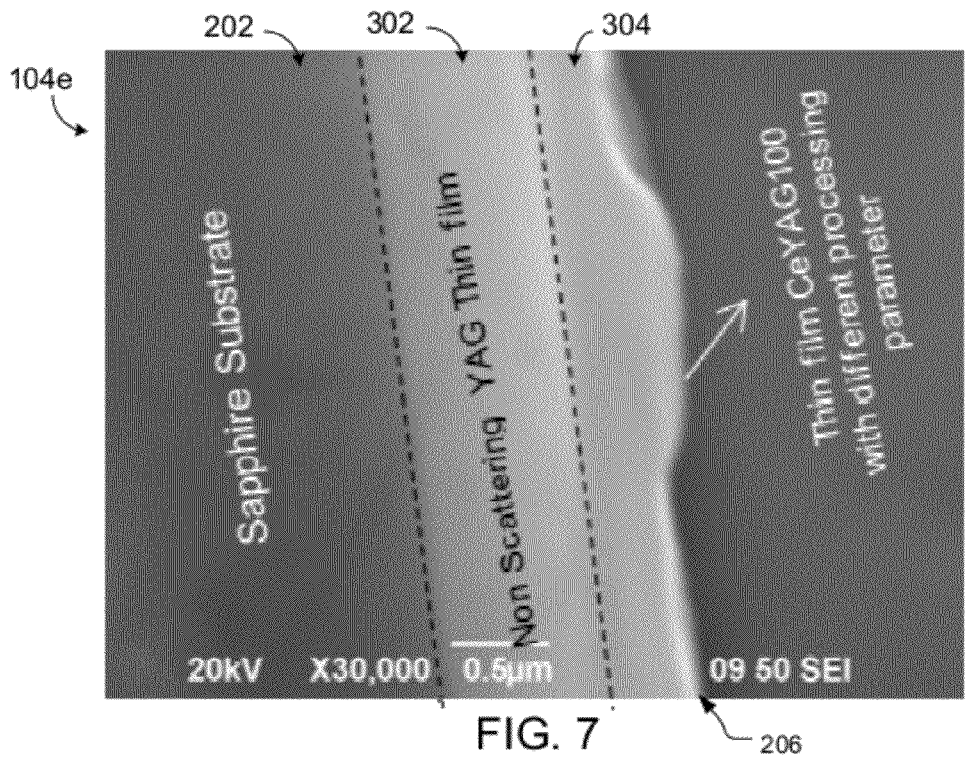
FIG. 7 is a scanning electron micrograph of another exemplary wavelength-converting structure including a thin film structure with a non-uniform top surface consistent with the present disclosure.

FIG. 7 is a scanning electron micrograph of another exemplary wavelength-converting structure 104e including a thin film structure with a non-uniform top surface consistent with the present disclosure. The wavelength-converting structure 104e includes a substrate 202, a thin film base layer 302 and a thin film surface layer 304 having an as-grown non-uniform top surface 206. In this example, the substrate 202 is sapphire and the thin film base layer 302 and thin film surface layer 304 are formed of the same material, i.e. YAG:Ce. The substrate 202 has a thickness of about 500 µm, the thin film base layer 302 has a thickness of about 1 µm, and the thin film surface layer 304 has a maximum thickness of about 1 µm. It is to be understood, however, that the thicknesses of the layers in the illustrated example are provided for illustration only, and that the thickness provided in any embodiment would depend on the desired amount of wavelength conversion in the application.

The thin film base layer 302 and thin film surface layer 304 shown in FIG. 7 were formed using pulsed laser deposition. Table 2 includes the nominal values for the first set of parameters (labeled "Base" in Table 2) associated with depositing the thin film base layer 302 and the second set of parameters (labeled "Surface" in Table 2) associated with depositing the thin film surface layer 304 having a non-uniform top surface 206.

TABLE 2

| Thin Film Layer | Temperature (° C.) | Deposition Pressure ($P_{O2}$ mTorr) | Laser Repetition Rate (Hz) | Total Number of Laser Pulses |
|---|---|---|---|---|
| Base | 1050 | 1 | 5 | 72000 |
| Surface | 850 | 20 | 20 | 24000 |

Figure 8A:
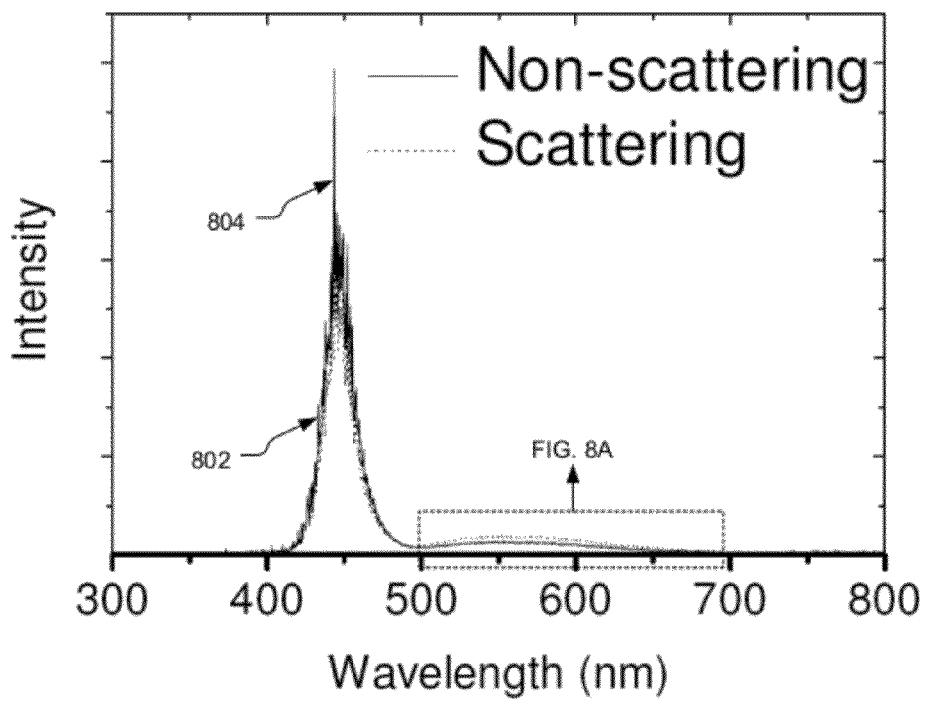
FIG. 8A includes plots of relative light output intensity vs. wavelength illustrating performance of a wavelength-converting structure consistent with the present disclosure.
Figure 8B:
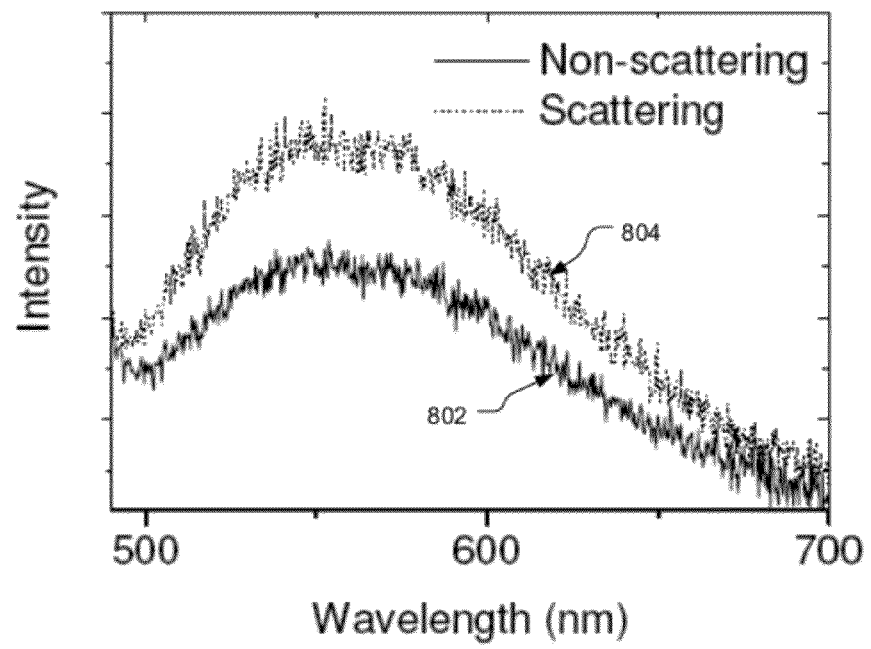
FIG. 8B includes the plots of relative light output intensity vs. wavelength shown in FIG. 8A for the wavelength range from 500 nm to 700 nm.

FIG. 8A includes plots 802, 804 of relative light output intensity in a direction normal to a light emitting surface vs. wavelength illustrating performance advantages of a wavelength-converting structure consistent with the present disclosure. In particular, plot 802 is a plot of light output intensity in a direction normal to a smooth, e.g. uniform, top surface of a thin-film wavelength converting structure, and plot 804 is a plot of light output intensity in a direction normal to a non-uniform top surface of a thin-film wavelength converting structure consistent with the present disclosure. The non-uniform top surface from which the data illustrated in plot 804 was obtained was formed by wet-etching the top surface of thin film structure having a uniform top surface to create a non-uniform top surface. FIG. 8B includes the plots 802 and 804 for the portion of FIG. 8A on the x-axis (wavelength) between 500 nm and 700 nm. As shown, the light output intensity normal to the top surface of a wavelength-converting structure having a non-uniform top surface is about 15% greater than the light output intensity normal to the top surface of a wavelength-converting structure having a uniform top surface.

Embodiments of a structure consistent with the present disclosure thus include a wavelength-converting structure including a thin film structure having a non-uniform top surface. The wavelength-converting structure may be combined into a wavelength-converted LED package whereby light emitted by an LED passes through the bottom surface of the wavelength-converting structure and through the thin film structure. The thin film structure is configured to be non-scattering while the non-uniform top surface is configured to be scattering. The non-uniform top surface is configured to improve light extraction from the thin film structure consistent with the present disclosure. Scattering within the thin film is inhibited enhancing transmission of light to the top surface while scattering at the top surface is configured to enhance out-coupling of light from the thin film structure consistent with the present disclosure. The non-uniform top surface of the thin film structure generally allows more light to escape from the wavelength-converting structure in the forward direction, i.e. normal to the emitting surface of the LED and the top surface of the wavelength-converting structure, compared to wavelength-converting structure without a non-uniform top surface. The thin film structure may be formed using a physical vapor deposition (PVD) process. At least one parameter associated with the PVD process may be adjusted during the PVD process in order to form the non-uniform top surface of the thin film structure.

According to one aspect of the disclosure, there is provided a light source including a light emitting diode (LED) configured to emit primary light from an emitting surface and a wavelength-converting structure. The wavelength-converting structure has a bottom surface in opposed facing relationship to the light emitting surface of the LED, and has a wavelength-converting material therein configured to emit secondary light in response to the primary light being imparted thereon. The wavelength-converting structure includes a thin film structure that has an as-grown non-uniform top surface.

According to another aspect of the disclosure, there is provided a light source including a light emitting diode (LED) configured to emit primary light from an emitting surface and a wavelength converting structure. The wavelength-converting structure includes a bottom surface in opposed facing relationship to the emitting surface of the LED and has a wavelength-converting material therein configured to emit secondary light in response to the primary light being imparted thereon. The wavelength-converting structure includes a thin film structure having a thickness less than about 20 μm. The thin film structure includes: a base layer formed of a first material and configured to emit the secondary light in response to the primary light, and a surface layer having a non-uniform top surface and formed on the base layer, the surface layer being formed of a second material that is the same as the first material.

According to another aspect of the disclosure, there is provided a method of forming a wavelength-converting structure for a wavelength-converted light emitting diode (LED) assembly wherein the wavelength-converting structure is configured to receive primary light from the LED and emit secondary light in response to the primary light being imparted thereon, the method including: depositing a thin film structure having a non-uniform surface; and positioning the thin film structure so that the secondary light is emitted through the non-uniform top surface.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A light source comprising:
   a light emitting diode (LED) configured to emit primary light from an emitting surface; and
   a wavelength-converting structure having a bottom surface in opposed facing relationship to said emitting surface of said LED, said wavelength-converting structure having a wavelength-converting material therein configured to emit secondary light in response to said primary light being imparted thereon, said wavelength-converting structure comprising a thin film structure formed on a substrate and having an as-grown non-uniform top surface having substantially random deviations D in the range of 100 nm to 5000 nm, said thin film structure consisting of a single crystalline base layer and a polycrystalline surface layer formed directly on said base layer, said base layer and said surface layer being comprised of the wavelength-converting material, and said surface layer having said non-uniform top surface.

2. A light source according to claim 1, wherein a thickness of said thin film structure is between 1 μm and 15 μm.

3. A light source according to claim 1, wherein said base layer has a thickness between 800 nm and 12 μm.

4. A light source according to claim 1, wherein said surface layer has a thickness between 200 nm and 3 μm.

5. A light source according to claim 1, wherein said thin film structure is formed on said LED.

6. A light source according to claim 1, wherein said base layer has a first index of refraction and said surface layer has a second index of refraction, said first index of refraction being within 10% of said second index of refraction.

7. A light source according to claim 1, wherein said base layer is formed on said LED.

8. A light source according to claim 1, wherein said non-uniform top surface has substantially random deviations in a range from 500 nm to 2000 nm.

9. A light source comprising:
   a light emitting diode (LED) configured to emit primary light from an emitting surface; and
   a wavelength-converting structure having a bottom surface in opposed facing relationship to said emitting surface of said LED, said wavelength-converting structure having a wavelength-converting material therein configured to emit secondary light in response to said primary light being imparted thereon, said wavelength-converting structure comprising a thin film structure having a thickness less than about 20 μm, said thin film structure consisting of:
   a single crystalline base layer, and
   a polycrystalline surface layer formed directly on said base layer and having an as-grown non-uniform top surface having substantially random deviations D in the range of 100 nm to 5000 , said base layer and said surface layer being comprised of the wavelength-converting material.

10. A light source according to claim 9, wherein said base layer has a thickness between 800 nm and 12 μm.

11. A light source according to claim 9, wherein said surface layer has a thickness between 200 nm and 3 μm.

12. A light source according to claim 9, said wavelength converting structure further comprising a substrate, said thin film structure being formed on said substrate.

13. A light source according to claim 9, wherein said base layer is a generally non-scattering base layer and said surface layer is a scattering surface layer.

\* \* \* \* \*